United States Patent [19]

Conley et al.

[11] Patent Number: 5,663,036

[45] Date of Patent: Sep. 2, 1997

[54] MICROLITHOGRAPHIC STRUCTURE WITH AN UNDERLAYER FILM COMPRISING A THERMOLYZED AZIDE

[75] Inventors: Willard Earl Conley, Cornwall; James Thomas Fahey, Poughkeepsie; Wayne Martin Moreau, Wappingers Falls, all of N.Y.; Ratnam Sooriyakumaran, San Jose, Calif.; Kevin Michael Welsh, Plymouth, Minn.

[73] Assignee: International Business Machines Corporation, Armonk, N.Y.

[21] Appl. No.: 354,579

[22] Filed: Dec. 13, 1994

[51] Int. Cl.$^6$ .................... G03C 1/492; G03C 1/52; G03C 1/815; G03C 1/06

[52] U.S. Cl. .................... 430/271.1; 430/156; 430/167; 430/512; 430/522

[58] Field of Search .................... 430/271.1, 512, 430/156, 167, 522

[56] References Cited

U.S. PATENT DOCUMENTS

| | | | |
|---|---|---|---|
| 3,923,522 | 12/1975 | Hata et al. | 96/115 R |
| 4,491,628 | 1/1985 | Ito et al. | 430/176 |
| 4,576,898 | 3/1986 | Hoffmann et al. | 430/306 |
| 4,605,465 | 8/1986 | Morgan | 156/273.3 |
| 4,631,249 | 12/1986 | Kalyanaraman | 430/325 |
| 4,931,351 | 6/1990 | McColgin et al. | 430/323 |
| 5,110,697 | 5/1992 | Lamb, III et al. | 430/14 |
| 5,206,116 | 4/1993 | Daniels et al. | 430/311 |
| 5,227,460 | 7/1993 | Mahabadi et al. | 528/272 |
| 5,401,613 | 3/1995 | Brewer et al. | 430/323 |

FOREIGN PATENT DOCUMENTS

| | | | |
|---|---|---|---|
| 4102252A | 10/1991 | Germany | G03F 7/03 |
| 50-40626 | 4/1975 | Japan . | |
| 57-151392A | 9/1982 | Japan | B41M 5/18 |
| 57-151395A | 9/1982 | Japan | B41M 5/18 |
| 52165623A | 7/1987 | Japan | G02B 5/20 |
| 63-60786 | 3/1988 | Japan . | |

OTHER PUBLICATIONS

English Translation of JP 50–40626, Tsunoda et al., Apr. 14, 1975.

English Translation of JP 63–60786, Kiribata, Mar. 16, 1988.

Yen et al., "An Anti–Reflection Coating for Use with PMMA at 193 nm", 139 J. Electrochem. Soc'y 616, 1992.

Willard Conley, et al., "Negative DUV Photoresist for 16Mb–DRAM Production and Future Generations", SPIE vol. 1925, pp. 120–132.

W. D. Hinsberg, et al., "Influence of Polymer Properties on Airbourne Chemical Contamination of Chemically Amplified Resists", SPIE vol. 1925, pp. 43–52.

John Wiley & Sons, A Wiley–Interscience Publication, "Photodegradation, Photo–oxidation and Photostabilization of Polymers", Principles and Applications.

T. Yamashita, et al., "Degradation of sulfur–containing aromatic polymers: Photodegradation of polyethersulfone and polysulfone", Polymer Degradation and Stability 39 (1993), pp. 47–54.

Hideo Hayashi, et al., "Polymerization Blending for Compatible Poly(ether sulfone)/Aramid Blend Based on Polycondensation of an N–Silylated Aromatic Diamine with an Aromatic Diacid CHloride in Poly (ether sulfone) Solution", Journal of Applied Polymer Science, vol. 49, (1993), pp. 1241–1249.

Primary Examiner—George F. Lesmes
Assistant Examiner—Bernard P. Codd
Attorney, Agent, or Firm—Steven J. Soucar; Dale M. Crockatt

[57] ABSTRACT

Microlithographic methods for the use of improved underlayers for chemically amplified deep UV photoresist compositions and structures produced thereby are disclosed. The compositions comprise, in admixture, a polymeric binder, and an azide which is thermolyzed during microlithographic processing to form an amine. Films formed from the underlayer compositions of the present invention, when applied immediately under and proximate to a chemically amplified photoresist film reduce the resist structure sidewall foot or undercut caused by an adverse contact reaction.

5 Claims, No Drawings

MICROLITHOGRAPHIC STRUCTURE WITH AN UNDERLAYER FILM COMPRISING A THERMOLYZED AZIDE

BACKGROUND OF THE INVENTION

1. Field of the Invention

The present invention generally relates a microlithographic process for using radiation sensitive photoresist compositions in the fabrication of integrated circuit devices, and more particularly, to a method for using compositions which are processing aids for controlling the sidewall profiles of structures formed from chemically amplified deep UV photoresist compositions and a structure formed thereby.

2. Discussion of the Related Art

In the fabrication of integrated circuits, the exposure of a photoresist to light and subsequent development to form a relief image are important process steps. The production of high density circuits having sub micron dimensions requires that such formation of relief images be accomplished within close processing tolerances. For example, it is important to control the linewidth of the imaged and developed photoresist so that any deviation from the nominal design linewidth is small, typically less than 10%. Furthermore, it is important to control the sidewall profile of the imaged and developed photoresist so as to obtain relatively vertical and straight sidewalls.

Resist sidewall profile is a very important attribute in a lithographically acceptable photoresist structure. Any degradation in sidewall angle or the presence of a foot or undercut will usually be transferred into the substrate during any subsequent etch step. Although, in certain cases, a foot or undercut may be tolerable when it represents only a small percentage of the overall critical dimension, the resist structure is typically considered unusable if it manifests such undesirable characteristics. As the critical dimension becomes smaller, such as less than about 0.40 μm, the percentage becomes larger and its effect becomes intolerable. As sidewall undercut becomes large in proportion to linewidth, undercut may causes the photoresist structure to fall over in the most extreme cases.

Many factors can affect sidewall profile. For example, interference patterns or standing waves may be caused by reflected light. Other distortions may arise from non-planar coatings of photoresist films or underlying topography. Still other distortions may arise from contact reactions, which are adverse reactions between the photoresist film and the underlying material.

In sub micron lithography, the use of acid amplified resists has become favored due to the high photospeed of such compositions. The use of acid amplified resist compositions is well known in the art. Such resist compositions are especially useful in conjunction with deep UV (about 180 to about 300 nm) exposure tools in view of the high photospeed requirements of such tools. The following references illustrate the state of the pertinent art.

U.S. Pat. No. 4,491,628 to Ito, et al., discloses chemically amplified photoresist compositions comprising a photosensitive acid progenitor and a polymeric component having acid labile groups pendent therefrom, wherein the acid labile groups are tert-butyloxycarbonyloxy groups.

Published patent application no. WO 94/10608 to Brunsvold, et al., discloses chemically amplified photoresist compositions comprising a non-metallic photosensitive acid progenitor, particularly sulfonic acid esters of N-hydroxyimides.

Conley, et al., "Advances in Resist Technology and Processing XI, *Proc. SPIE.*," 1925, 120 (1994) discloses a negative tone chemically amplified photoresist composition comprising polyhydroxystyrene, tetramethoxymethyl glycouril, and a N-hydroxy sulfonate photosensitive acid progenitor.

Although chemically amplified photoresist compositions are favored for sub micron lithography, many chemically amplified photoresists are adversely affected by the presence of certain chemical species, particularly amines. Hinsberg, et al., have discussed particular examples of adverse reactions with N-methyl pyrrolidone. See, Hinsberg, et al., "Advances in Resist Technology and Processing XI, *Proc. SPIE.*," 1925, 43 (1994), and references therein. For example, where an acid catalyzed cleavage of an acid labile group is required to render the resist composition differentially soluble, a competing reaction between the photogenerated acid and particular chemical species such as an amine will slow or interrupt the cleavage reaction prior to sufficient cleavage of the acid labile group. In such event, acceptable relief images can not be obtained. The degree of completion of the cleavage reaction varies highly depending upon the remaining, unconsumed acid present in the resist at the commencement of the post exposure bake step. The results of such adverse reactions are often unpredictable.

Where the chemical species which reacts with the chemically amplified photoresist emanates from the underlying material, the adverse reaction is often deemed a contact reaction and may be characterized by the formation of a foot, or alternatively an undercut profile, in the sidewall. In the case of an acid catalyzed, positive tone resist, an undercut profile can result from the presence of excess acid species generated in the region of the undercut, which may arise from either the resist or more often the underlying material. In the case of an acid catalyzed, negative tone resist, the resulting profile includes a foot, which may similarly arise from either the resist or more often the underlying material.

Antireflective underlayer compositions are well known microlithographic processing aids. Films formed from such compositions are often applied to microlithographic substrates prior to the application of a photoresist film to control standing waves and other optical aberrations. However, many antireflective underlayer compositions undergo adverse contact reactions with chemically amplified photoresist compositions.

As a result of the propensity of many chemically amplified photoresist compositions to undergo unwanted contact reactions, it is useful to modify the underlying material to compensate for such adverse contact reactions. Thus, a modified underlayer composition, a corresponding lithographic process for the use thereof, is needed for use with chemically amplified photoresist compositions.

SUMMARY OF THE INVENTION

An object of the present invention is to provide a method of use for improved underlayer compositions together with chemically amplified photoresist compositions.

Another object of the present invention is to provide a method of use for underlayer compositions together with acid catalyzed, chemically amplified photoresist compositions.

Yet another object of the present invention is to provide a method for using underlayer compositions which reduce or eliminate a photoresist structure sidewall foot.

Yet another object of the present invention is to provide a method for using underlayer compositions which reduce or eliminate a photoresist structure sidewall undercut.

Thus, according to the invention, microlithographic methods for the use of improved underlayers for chemically amplified deep UV photoresist compositions and structures produced thereby are disclosed. The underlayer compositions comprise, in admixture, a polymeric binder, and a precursor of a basic species such as an azide which is thermolyzed during microlithographic processing to form an amine. Films formed from the underlayer compositions of the present invention, when applied immediately under and proximate to a chemically amplified photoresist film reduce the resist structure sidewall foot or undercut caused by an adverse contact reaction.

DETAILED DESCRIPTION OF THE PREFERRED EMBODIMENTS

The present invention provides novel methods for the use of improved underlayers for chemically amplified deep UV photoresist compositions. The underlayer compositions comprise, in admixture, a polymeric binder and a precursor of a basic species which is thermolyzed during microlithographic processing. Films formed from the underlayer compositions of the present invention reduce the resist structure sidewall foot or undercut caused by an adverse contact reaction.

Underlayer compositions comprising a polymeric binder in admixture with a compound comprising a primary, secondary, or tertiary amine have been found to be disadvantageous in the present method. Typically, such compounds comprising an amine have a short resident time in the underlayer and are volatilized during the underlayer processing. In the present invention, the use of precursor of a basic species which is thermolyzed during microlithographic processing, and which basic species thus produced remains in the underlayer film during the subsequent processing, is advantageous. An example of a precursor of a basic species is an azide. Such azides, when thermolized, typically crosslink or otherwise add to the polymer binder of the underlayer film. During such crosslinking or addition, primary and secondary amines are formed. These basic species remain in the film since they are immobilized by entrainment, complexation, or chemical bonding to the polymeric binder.

Precursors of basic species which are useful in the present invention are selected according to the following functional criteria. First, the precursor must be miscible with the polymeric binder. By miscible, it is meant that the precursor and the polymeric binder should not separate into distinct phases during lithographic processing. Second, the precursor must be capable of being thermally treated, or thermolyzed, to produce a species comprising a basic moiety which, in turn, is capable of reacting with or sequestering an acidic species produced by a photosensitive acid generator. Third, the resulting basic species should be immobily bound to the polymeric binder of the underlayer film so as to minimize extraction by, or diffusion into, an overlaying photoresist film. Finally, where the underlayer film is obtained by applying a solution of an underlayer composition to a substrate, the precursor should be soluble in the solvent for the underlayer composition.

Useful precursors of basic species include azides which form an amine upon thermolysis and which satisfy the above described functional criteria. Other useful precursors of basic species include 1-azidopyrene, methyl 2-(4'-methoxyanilino)-5-azidobenzoate, 2-anilino-5-azidobenzoic acid, 2-(4'-azidophenyl)-6-methylbenzothiazole, and 2-(4'-azidophenyl)-(naphtho-1',2'-4,5oxazole). In alternative embodiments, the precursors may be polymeric azides. An example of a polymeric amine is poly(p-azidostyrene). In yet other alternative embodiments, thermolysis of the precursor gives rise to species which are both basic and also inherently absorbent of ultraviolet radiation, so as to function as antireflective chromophores.

Preferred precursors of basic species will have a plurality of substituents capable of being thermolyzed to form basic substituents. An example of a precursor having a plurality of substituents capable of being thermolyzed is a bis-azide.

Particularly preferred precursors of basic species are selected from the group consisting of 4,4'-diazidostilbene, 4,4'-diazidochalcone, 4,4'-diazidobenzophenone, 2,6-bis(4'-azidobenzylidene)cyclohexanone, 2,6-bis(4'-azidobenzylidene) 4-methylcyclohexanone, 1,6-diazidopyrene, 4,4'-diazidodiphenylmethane, 3,3'-diazidodiphenyl sulfone, and precursors comprising one or more phenylsulfonylazide substituents.

Typical concentrations for the precursor in the underlayer compositions, where the concentration is expressed relative to the polymeric binder, are in the range from about 1% (w/w) to an upper limit determined only by miscibility with the polymeric binder and solubility in the underlayer casting solvent. In preferred embodiments, the range of precursor concentrations is from about 3% (w/w) to about 10% (w/w).

The concentration for the precursor in the underlayer composition is selected to optimize the desired lithographic result as follows. In a typical process using a known, commercially available, positive tone chemically amplified photoresist over a known, commercially available underlayer, a re-entrant, or undercut, resist sidewall profile is obtained at the interface between the underlayer film and the resist film. The severity of the undercut is dependent on the process conditions, including the post apply bake, the post exposure bake, and exposure dose conditions. Depending on the required process and materials, the worker can select an underlayer having a concentration of basic species precursor to eliminate any observable undercut. In the above process, when an underlayer comprising about 5% (w/w) of a typical azide precursor is used, a slight foot is observed. In the above process, when an underlayer comprising about 8% (w/w) of a typical azide precursor is used, a more pronounced foot is observed. Finally, when an underlayer comprising about 3 to about 4% (w/w) of a typical azide precursor is used, a vertical sidewall profile is observed.

In the case of a negative tone chemically amplified photoresist over a known, commercially available underlayer, a severe foot is observed at the interface. In this process, when an underlayer comprising about 3% (w/w) of a typical azide precursor is used, a slight foot is observed. When an underlayer comprising about 5 to about 6% (w/w) of a typical azide precursor is used, a vertical sidewall profile is observed. When an underlayer comprising about 10% (w/w) is used, a re-entrant profile occurs as the acid catalyzed chemistry is extinguished.

In other preferred embodiments, the precursors of basic species will undergo essentially complete thermal reaction to form the basic species during the lithographic processing of the underlayer film. It is particularly preferred that this reaction progress essentially to completion during any post apply bake to which the underlayer film is subjected, and prior to the application of the chemically amplified resist. In other particularly preferred embodiments, the essentially complete thermolysis of the precursor will occur at a temperature which is less than the glass transition temperature of the polymeric binder, and during a period of time which is less than the duration of the underlayer post apply bake.

In the present invention, the polymeric binder and the precursor of the basic species may be separate components. Alternatively, the polymeric binder and precursor may be chemically linked together comprising a polymer having a pendent precursor group. Useful polymers in the present invention include any polymer of which a thin film having a thickness in the range from about 50 nm to about 1 μm may be obtained, and which are miscible with the precursor of the basic species, and which are capable of immobily binding the basic species, and which are essentially insoluble in the casting solvent for the chemically amplified photoresist composition.

Preferred polymers include polyarylether sulfones, poly(vinyl naphthalenes), polyarylether ketones, and polycarbonates.

It has been discovered that the underlayer compositions of the present invention are particularly useful substitutes for known underlayer composition which comprise polymers such as polyarylether sulfones and polycarbonates. Such polymers are known to undergo photochemical reactions in the presence of deep UV radiation to yield acidic products. See, Yamashita, et al., Polymer Degradation and Stability 39, 47 (1993); Ranby, et al., Photodegradation, Photooxidation and Photostabilization of Polymers, Principles and Applications, John Wiley and Sons, London, (1975), at 223–227. Underlayer compositions of the present invention comprising a polyarylether sulfone, or alternatively a polycarbonate, and further comprising a precursor of a basic species are demonstrably more desirable than the corresponding known underlayer compositions when used with chemically amplified photoresists, in that the photochemically generated acid moiety from the underlayer polymeric binder is neutralized by the basic species produced by the precursor and does not give rise to an adverse contact reaction.

It is known that certain chemically amplified photoresists may exhibit an increase, or less commonly a decrease, in the required dose of exposing radiation for patterning after contact with, or exposure to, amines. In the case of either a positive tone, or a negative tone, acid amplified photoresist, where the nucleophilic species component is basic in nature, the adverse reaction is manifested by an increase in the required dose of exposing radiation. This results from an adverse reaction wherein the basic nucleophilic species combines with and sequesters the acid species generated by the photosensitive acid progenitor, which acid is necessary for catalysis of the cleavage reaction. Where there is an increase in required exposure dose, the resist is deemed to be desensitized. As the practitioner will understand, the character of the observed adverse effect is reversed for an acid amplified photoresist where the nucleophilic species component is strongly acidic in nature, resulting in a decreased exposure dose requirement, or hypersensitivity, and often a shortened storage life. Similarly, where the chemically amplified resist involves photogenerated base catalysis, the presence of a deleterious acidic nucleophilic species component ultimately leads to desensitization, and a strongly basic nucleophilic species component leads to hypersensitization and reduced storage life. Although it is known that basic species such as amines can adversely affect chemically amplified photoresists, it has been surprisingly found that the basic species of the underlayer produced by the method of the present invention do not adversely affect the overall sensitivity of the chemically amplified photoresist which is applied over the underlayers of the invention.

The following examples are illustrative of the invention.

EXAMPLE 1

Preparation of underlayer composition comprising a precursor of a basic species

To a mixture of about 2.88 g of UDEL® polyarylether sulfone (which is commercially available from AMOCO Chemical Company) and about 0.144 g of 2,6-bis(4'-azidobenzylidene)-4-methylcyclohexanone (which is commercially available from Eastman Kodak Company), was added about 96.98 g of cyclohexanone. The components were mixed to form a homogeneous solution and filtered to obtain a liquid underlayer composition.

EXAMPLE 2

Preparation of positive tone chemically amplified photoresist

To a mixture of about 10 parts by weight poly(4-tert-butyloxycarbonyloxystyrene)-co-(4-hydroxystyrene), about 1 part by weight of N-(trifluoromethylsulfonyloxy)-bicyclo-[2.2.1]-hept-5-ene-2,3-dicarboximide, and about 1 part by weight of Tetronic® 1501 surfactant (which is commercially available from BASF Chemical Company) was added propylene glycol monomethyl ether acetate. The components were mixed to form a homogeneous solution and filtered to obtain a chemically amplified photoresist composition.

EXAMPLE 3

Microlithographic structure comprising a positive tone, chemically amplified photoresist film overlaying an underlayer film A microlithographic structure was prepared according to the following method. The composition of Example 1 was spin cast over bare silicon wafers and then baked in a convection oven at about 225° C. for 30 minutes to form an underlayer film having a thickness of about 900 Å. The composition of Example 2 was then spin cast over the underlayer film and softbaked at a temperature of about 90° C. for 60 seconds on a vacuum hotplate to form a film having a thickness of about 850 nm. The wafer was patternwise exposed on a Canon FPA 4500 exposure system to excimer laser DUV radiation having a wavelength of 248 nm. The exposed wafer was promptly baked at about 90° C. for about 90 seconds and developed by immersion in 0.21N aqueous tetramethylammonium hydroxide (TMAH) for about 60 seconds. The wafer was then analyzed by a scanning electron microscope to measure the amount of undercut and/or foot present in the photoresist structure at the resist film to underlayer film interface.

By repeating the process with different underlayer compositions comprising varying amounts of 2,6-bis(4'-azidobenzylidene)-4-methylcyclohexanone, it was determined that about 3% (w/w) of the precursor eliminated any observable undercut in the resist sidewall profile.

EXAMPLE 4

Microlithographic structure comprising a negative tone, chemically amplified photoresist film overlaying an underlayer film A microlithographic structure was prepared according to the method of Example 3, with the following exceptions. A negative tone chemically amplified photoresist composition designated CGR-248 (which is commercially available from Shipley Company, Division of Rohm and Haas Company) was substituted for the composition of Example 2. The latent image was developed using 0.14N TMAH. By repeating the process with different underlayer compositions comprising varying amounts of 2,6-bis(4'-azidobenzylidene)-4-methylcyclohexanone percentage, it was determined that about 5% (w/w) of the precursor eliminated any observable foot in the resist sidewall profile.

Upon a reading of the present disclosure, it will be apparent to the skilled artisan that other embodiments of the present invention beyond those embodiments specifically described herein may be made or practiced without departing from the spirit of the invention. Similarly, changes, combinations and modifications of the presently disclosed embodiments will also become apparent. For example, while all embodiments described herein refer to a precursor of a basic species and an acid catalyzed chemically amplified resist, it will be apparent that a precursor of an acidic species will be useful together with a base catalyzed chemically amplified resist. The embodiments disclosed and the details thereof are intended to teach the practice of the invention and are intended to be illustrative and not limiting. Accordingly such apparent but undisclosed embodiments, changes combinations, and modifications are considered to be within the spirit and scope of the present invention as limited solely by the appended claims.

What is claimed is:

1. A microlithographic structure comprising:
    a) a microlithographic substrate;
    b) applied to a surface of said substrate, an underlayer film comprising a polymeric binder and a basic species, wherein said basic species has been produced by thermolyzing a precursor of said basic species, wherein the precursor is an azide selected from the group consisting of 1-azidopyrene, methyl 2-(4'-methoxyanilino)-5-azidobenzoate, 2-anilino-5-azidobenzoic acid, 2-(4'-azidophenyl)-6-methylbenzothiazole, and 2-(4'-azidophenyl)-(naphtho-1',2'-4,5oxazole); and
    c) overlaying said underlayer film, a chemically amplified photoresist film, wherein an acid is generated in said photoresist film upon exposure to radiation.

2. The structure of claim 1 wherein said basic species is inherently absorbent of ultraviolet radiation, and wherein said underlayer film is an antireflective film.

3. The structure of claim 1 wherein said underlayer film contains essentially no unthermolyzed precursor.

4. The structure of claim 1 wherein said underlayer film is formed from a composition comprising from about 3 to about 10% of the precursor.

5. The structure of claim 1 wherein the polymeric binder is selected from the group consisting of polyarylether sulfones, polyarylether ketones, poly(vinyl naphthalenes), and polycarbonates.

* * * * *